United States Patent [19]

Umemura et al.

[11] Patent Number: 4,680,499

[45] Date of Patent: Jul. 14, 1987

[54] PIEZOELECTRIC ULTRASONIC TRANSDUCER WITH ACOUSTIC MATCHING PLATE

[75] Inventors: Shin'ichiro Umemura, Hachioji; Hiroshi Takeuchi, Matsudo; Kageyoshi Katakura; Chitose Nakaya, both of Tokyo, all of Japan

[73] Assignees: Hitachi, Ltd.; Hitachi Medical Corporation, both of Tokyo, Japan

[21] Appl. No.: 849,833

[22] Filed: Apr. 9, 1986

[30] Foreign Application Priority Data

Apr. 10, 1985 [JP] Japan ........................ 60-74289

Aug. 30, 1985 [JP] Japan ........................ 60-189662

[51] Int. Cl.$^4$ ........................ H01L 41/08

[52] U.S. Cl. ........................ 310/334; 310/366; 310/327; 73/644

[58] Field of Search ........................ 310/322, 366, 334–337, 310/800, 327; 73/642, 644

[56] References Cited

U.S. PATENT DOCUMENTS

| | | | |
|---|---|---|---|
| 4,211,949 | 7/1980 | Brisken et al. | 310/334 X |
| 4,366,406 | 12/1982 | Smith et al. | 310/336 X |
| 4,424,465 | 1/1984 | Ohigashi et al. | 310/366 X |
| 4,473,769 | 9/1984 | Nguyen | 310/334 |
| 4,523,122 | 6/1985 | Tone et al. | 310/335 X |

*Primary Examiner*—Mark O. Budd

*Attorney, Agent, or Firm*—Antonelli, Terry & Wands

[57] ABSTRACT

A monolithic array ultrasonic transducer has a plurality of transducer elements formed thereon by isolating metallized areas on a piezoelectric plate without cutting the piezoelectric plate apart for each transducer element, and an acoustic matching layer having a longitudinal wave velocity within ±25% of a longitudinal wave velocity of the piezoelectric plate and a thickness equal to one half of that of the piezoelectric plate. The acoustic matching layer suppresses the radiation to an object of a partial wave in a direction of 60° to a normal line to the plane of the piezoelectric plate.

5 Claims, 4 Drawing Figures

PIEZOELECTRIC ULTRASONIC TRANSDUCER WITH ACOUSTIC MATCHING PLATE

BACKGROUND OF THE INVENTION

The present invention relates to an ultrasonic transducer suitable for a sensor in an ultrasonic imaging device such as ultrasonic diagnostic device or ultrasonic deflect detectors.

An array type ultrasonic transducer having a monolithic piezoelectric plate (monolithic array transducer) inherently has a high performance and a low manufacturing cost which are compatible. One example thereof is shown in U.S. Patent Application Ser. No. 676,314 filed in 1984 by the inventors of the present invention. In this type of transducer, since a transducer element of the array is not mechanically cut, a partial wave which laterally propagates along the piezoelectric plate is generated, which degrades an image quality.

SUMMARY OF THE INVENTION

It is an object of the present invention to provide an ultrasonic transducer which resolves the problem inherent to the monolithic array transducer and can provide a high quality of image with a low cost.

In order to achieve the above object, the monolithic array transducer of the present invention comprises a monolithic piezoelectric plate and an acoustic matching layer formed on a surface of the piezoelectric plate and having approximately one half of a thickness of the piezoelectric plate and made of a material having a substantially equal longitudinal wave velocity to that of the piezoelectric plate.

The material of the acoustic matching layer is selected such that it has a longitudinal wave velocity which is within ±25% of that of the piezoelectric plate. Preferably, it is within ±15%.

In accordance with the arrangement of the present invention, partial waves generated in the piezoelectric plate in directions other than normal to the plane of the piezoelectric plate are suppressed from being radiated to an object so that the transducer can provide a high quality of image. More specifically, an acoustic wave which is normal to the plane of the acoustic piezoelectric plate which has a thickness equal to λ/2, where λ is a wavelength of the acoustic wave used, as well as partial waves in various directions are generated in the piezoelectric plate. Of those partial waves, the partial wave in a direction in which an acoustic path length in the piezoelectric plate is λ, that is, in a direction of 60° to a normal line to the plane of the piezoelectric plate is strongest. In the prior art, the acoustic matching layer has a thickness of λ/4 and is designed to radiate the acoustic wave normal to the plane of the piezoelectric plate most efficiently. In the prior art acoustic matching layer, since the longitudinal wave velocity is lower than that of the piezoelectric plate, the partial wave in the direction of 60° propagates at a smaller angle in the acoustic matching layer. Accordingly, such partial wave is radiated to the object with a fairly high efficiency. On the other hand, in accordance with the present invention, the partial wave in the direction of 60° propagates in the direction of substantially 60° in the acoustic matching layer. Therefore, the acoustic matching layer has a path length substantially equal to λ/2 to the partial wave. As a result, the partial wave is essentially not radiated to the object.

Thus, in accordance with the present invention, the radiation of the strongest partial wave to the object is suppressed and the transducer can attain a high quality of image.

DESCRIPTION OF THE PREFERRED EMBODIMENTS

Figure 1:
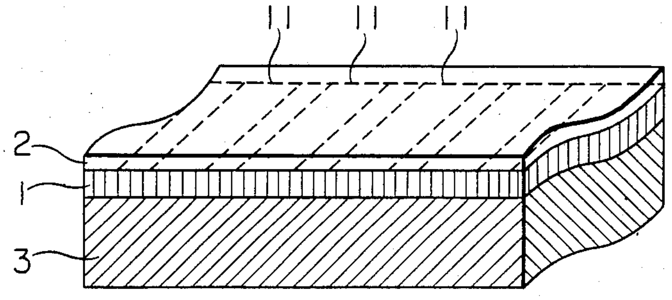
FIGS. 1 and 2 show perspective view and sectional view of one embodiment of the present invention.

In an embodiment shown in FIG. 1, an acoustic matching layer 2 having a thickness approximately one half of a thickness of a piezoelectric plate 1 is formed on a front surface of the piezoelectric plate 1, and a backing material 3 is formed on a back surface of the piezoelectric plate 1. One surface of the piezoelectric plate 1 is metallized to have stripes 11, and the other surface is metallized over the entire surface. In this manner, a monolithic array transducer having a plurality of transducer elements arranged on one piezoelectric plate is provided.

The present embodiment is intended to transmit and receive an acoustic wave to and from a living body (acoustic impedance $1.5\times10^6$ kg/m$^2$.sec), and a PZT ceramic (lead-zirconate-titanate) having a longitudinal wave velocity of 3800 m/sec, an acoustic impedance of $28\times10^6$ kg/m$^2$.sec and a thickness of 0.7 mm is used as the piezoelectric plate a resonance frequency of the transducer is 2.7 MHz. On the other hand, a polymethylole melamine resin having a thickness of approximately 0.35 mm, a longitudinal wave velocity of 3300 m/sec and an acoustic impedance of $5\times10^6$ kg/m$^2$.sec is used as the acoustic matching layer 2 which is formed on the piezoelectric plate 1. The above-mentioned melamine resin may exemplarily have a molecular formula such as

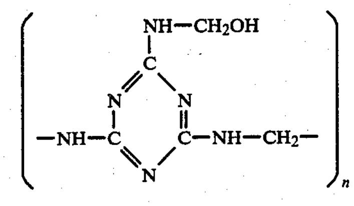

or

-continued

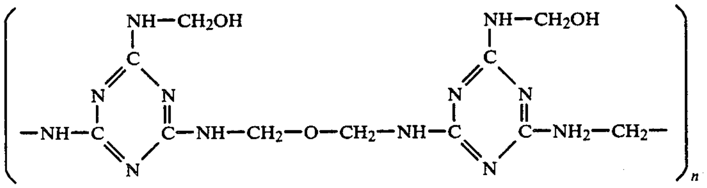

Rubber having powders of metal oxide mixed thereto is used as the backing material 3.

Figure 2:
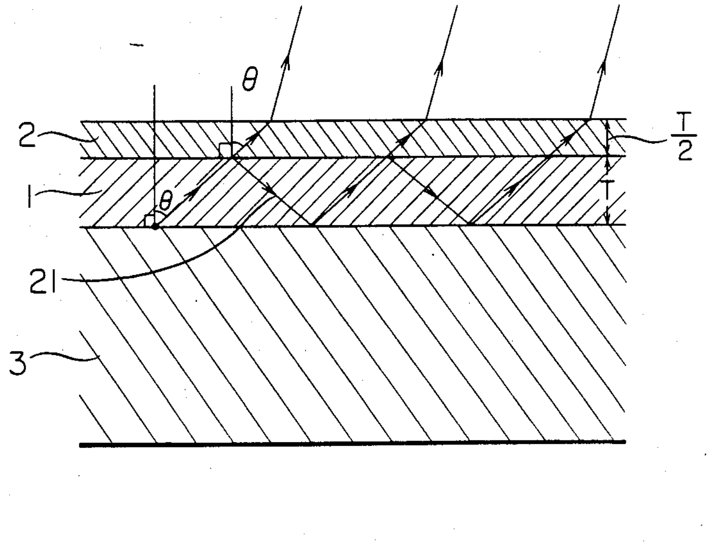

By using the acoustic matching layer 2 having the essentially equal longitudinal wave velocity to that of the piezoelectric plate 1, the radiation of the partial wave to the object, which would be radiated obliquely from the piezoelectric plate, is suppressed. This will be explained with reference to FIG. 2. The thickness T of the piezoelectric plate 1 is given by $$T=\lambda/2=f_r C/2$$

where $f_r$ is a resonance frequency, λ is a wavelength and C is a longitudinal wave velocity. When the piezoelectric plate is excited at the frequency $f_r$, an acoustic wave normal to the plane of the piezoelectric plate as well as partial waves in directions of θ to the normal line are generated. Of those partial waves, the partial wave in the direction of $T/\cos\theta=\lambda$ or $\theta=60°$ is strongest. This partial wave 21 is repeatedly reflected by the front surface and the back surface of the piezoelectric plate 1 and propagates laterally. When the acoustic velocities of the piezoelectric plate 1 and the acoustic matching layer 2 are substantially equal, a portion of the partial wave is not essentially refracted at the interface and goes into the acoustic matching layer 2. Since the acoustic matching layer has a thickness of λ/4, a path length of the partial wave in the acoustic matching layer is $\lambda/4\cdot 1/\cos\theta=\lambda/2$. Accordingly, this partial wave is not essentially radiated from the acoustic matching layer 2 to the object.

On the other hand, the prior art λ/4 acoustic matching layer has a much lower longitudinal wave velocity than that of the piezoelectric plate. Accordingly, the partial wave in the direction of 60° propagates at a smaller angle in the acoustic matching layer by refraction. Thus, the path length is shorter than λ/2 and the partial wave is radiated to the object with a high efficiency.

In order to effectively suppress the emission of the partial wave to the object, it is necessary that the longitudinal wave velocity of the acoustic matching layer is within ±25% of that of the piezoelectric plate. The effect is remarkable if it is within ±15%. When the lead-zirconate-titanate (PZT ceramic) (having longitudinal wave velocity of 3800 ms) is used as the piezoelectric plate, the materials of the acoustic matching layer which meets the above requirement are polymethylole melamine resin and glass (trade name EDF-4, longitudinal wave velocity 3700 m/sec). When a lead titanate ($PbTiO_3$) ceramic (longitudinal wave velocity 4400 m/sec) is used as the piezoelectric plate, the polymethylole melamine resin or the glass described above may also be used as the acoustic matching layer. The above glass has an acoustic impedance of $17.4\times10^6$ kg/m².sec which is too high to the impedance matching between the piezoelectric ceramic and the living body. An excellent result is obtained by laminating the resin acoustic matching layer on the glass acoustic matching layer.

In any case, it is most desirable that the thickness of the acoustic matching layer is λ/4 if the propagation efficiency of only the wave normal to the plane is considered. However, from the standpoint of the suppression of the partial wave radiation, it is desirable that the thickness of the acoustic matching layer is not exactly λ/4 but is T/2 irrespective of a difference between the velocities, where T is a thickness of the piezoelectric plate.

The polymethylole melamine resin used in the above embodiment is easy to be formed and has a high acoustic velocity among the polymer materials. As a result, the acoustic impedance is as high as $5\times10^6$ kg/m².sec and it can be used as the acoustic matching layer, without anything mixed, between an electroacoustic transducer material such as piezoelectric ceramics and a medium such as water or human body. Accordingly, the acoustic matching layer can advantageously be obtained having a higher uniformity than the prior art acoustic matching layer made of epoxy resin having metal particles or metal oxide particles mixed therewith to increase its specific gravity.

Figure 3:
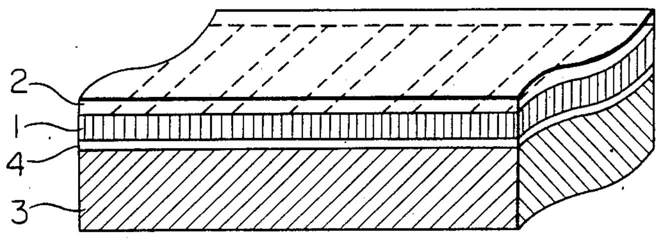
FIGS. 3 and 4 show perspective view and sectional view of another embodiment of the present invention.

FIG. 3 shows another embodiment of the present invention. The present embodiment differs from the embodiment of FIG. 1 in that a second acoustic matching layer 4 having a thickness of T/4 is formed between the piezoelectric plate 1 and the backing material 3. The structures and materials of other portions are identical to those of the embodiment of FIG. 1. The second acoustic matching layer 4 is made of glass (trade name EDF-4, longitudinal wave velocity 3700 m/sec).

Figure 4:
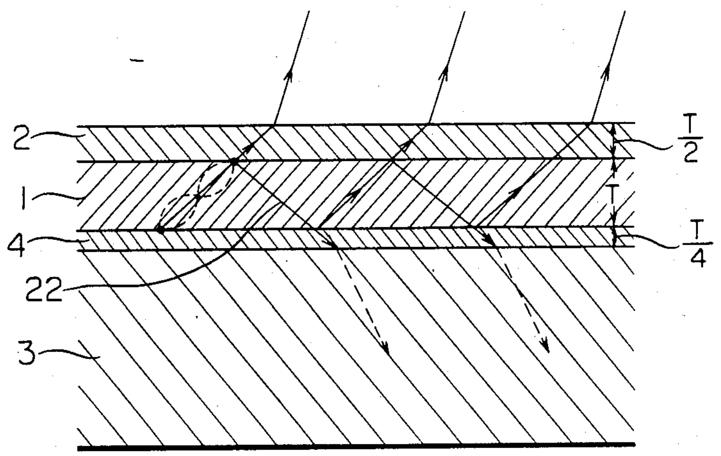

FIG. 4 illustrates the function of the second acoustic matching layer 4. The partial wave in the direction of 60° is reflected on the surface of the piezoelectric plate 1 and radiated to the backing material 3 from the back surface through the second acoustic matching layer. Since the path length of the partial wave in the acoustic matching layer 4 is substantially λ/4, the partial wave 22 is efficiently directed to the backing material 3 and is absorbed thereby. As a result, the affect by the partial wave is further suppressed than in the first embodiment. The longitudinal wave velocity of the acoustic matching layer 4 to attain the above effect is within ±25% of the longitudinal wave velocity of the piezoelectric plate 1, and more preferably within ±15%.

We claim:

1. An ultrasonic transducer comprising:
   a piezoelectric plate having both surfaces thereof metallized and at least one of the surfaces having a plurality of isolated metallized areas;
   a backing material formed on the back surface of said piezoelectric plate; and
   an acoustic matching plate formed on the front surface of said piezoelectric plate, having a longitudinal wave velocity within ±25% of a longitudinal wave velocity of said piezoelectric plate and having a thickness equal to one half of a thickness of said piezoelectric plate.

2. An ultrasonic transducer according to claim 1, wherein the longitudinal wave velocity of said acoustic matching plate is within ±15% of the longitudinal wave velocity of said piezoelectric plate.

3. An ultrasonic transducer according to claim 1, wherein said acoustic matching layer is made of polymethylole melamine resin.

4. An ultrasonic transducer comprising:

a piezoelectric plate having both surfaces thereof metallized and at least one of the surfaces having a plurality of isolated metallized areas;

a backing material formed on the back surface of said piezoelectric plate;

a first acoustic matching layer formed on the front surface of said piezoelectric plate and having a longitudinal wave velocity within ±25% of a longitudinal wave velocity of said piezoelectric plate and a thickness equal to one half of a thickness of said piezoelectric plate; and a second acoustic matching layer formed between said piezoelectric plate and said backing material and having a longitudinal wave velocity within ±25% of the longitudinal wave velocity of said piezoelectric plate and a thickness no larger than $\frac{1}{4}$ of a thickness of said piezoelectric plate.

5. An ultrasonic transducer according to claim 4, wherein the longitudinal wave velocities of said first and second acoustic matching layers are within ±15% of the longitudinal wave velocity of said piezoelectric plate.

* * * * *